(12) United States Patent
Garofalo

(10) Patent No.: US 10,164,624 B2
(45) Date of Patent: Dec. 25, 2018

(54) APPARATUSES FOR REDUCING OFF STATE LEAKAGE CURRENTS

(71) Applicant: MICRON TECHNOLOGY, INC., Boise, ID (US)

(72) Inventor: Pierguido Garofalo, San Donato Milanese (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/857,144

(22) Filed: Dec. 28, 2017

(65) Prior Publication Data

US 2018/0123577 A1    May 3, 2018

Related U.S. Application Data

(62) Division of application No. 15/217,449, filed on Jul. 22, 2016, now Pat. No. 9,893,723.

(51) Int. Cl.
*H03K 17/687* (2006.01)
*H03K 17/06* (2006.01)
*G11C 7/06* (2006.01)
*G11C 7/10* (2006.01)
*G11C 7/22* (2006.01)
*G11C 7/08* (2006.01)
*G11C 11/4091* (2006.01)

(52) U.S. Cl.
CPC ............ *H03K 17/063* (2013.01); *G11C 7/08* (2013.01); *G11C 7/1063* (2013.01); *G11C 11/4091* (2013.01); *G11C 2207/2245* (2013.01)

(58) Field of Classification Search
CPC ..... G11C 11/4091; G11C 7/08; G11C 7/1063; G11C 2207/2245; H03K 17/063
See application file for complete search history.

(56) References Cited

U.S. PATENT DOCUMENTS

| | | |
|---|---|---|
| 5,789,781 A | 8/1998 | McKitterick et al. |
| 6,160,437 A | 12/2000 | Kim et al. |
| 6,552,675 B1 | 4/2003 | Allin et al. |
| 6,605,977 B2 | 8/2003 | Martini et al. |
| 6,911,860 B1 | 6/2005 | Wang et al. |
| 7,728,649 B1 | 6/2010 | Webb et al. |
| 7,940,110 B2 | 5/2011 | von Kaenel et al. |
| 8,212,604 B2 | 7/2012 | Dianbo et al. |
| 8,354,872 B2 | 1/2013 | von Kaenel et al. |
| 8,860,497 B1 | 10/2014 | Yu et al. |
| 9,013,228 B2 | 4/2015 | Hasbani |
| 9,094,008 B2 | 7/2015 | Lee |
| 9,893,723 B1 * | 2/2018 | Garofalo .................. G11C 7/08 |

* cited by examiner

*Primary Examiner* — Kenneth B Wells
(74) *Attorney, Agent, or Firm* — Dorsey & Whitney LLP

(57) ABSTRACT

Apparatuses for reducing leakage currents during an off state for transistors is described herein. An example apparatus includes a switch having an input node and an output node. The switch is configured to couple a signal on the input to the output node when the switch is in an on state and is further configured to decouple the input and output nodes when the switch is in an off state. The switch includes first and second transistors, and further includes third and fourth transistors. A drain electrode of the first transistor is coupled to a source electrode of the third transistor, a drain electrode of the second transistor is coupled to a source electrode of the fourth transistor, and the drain electrodes of the third and fourth transistors are coupled together to the output node.

20 Claims, 5 Drawing Sheets

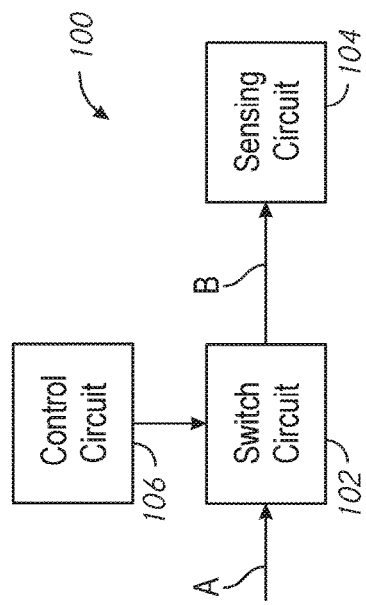
FIG. 1
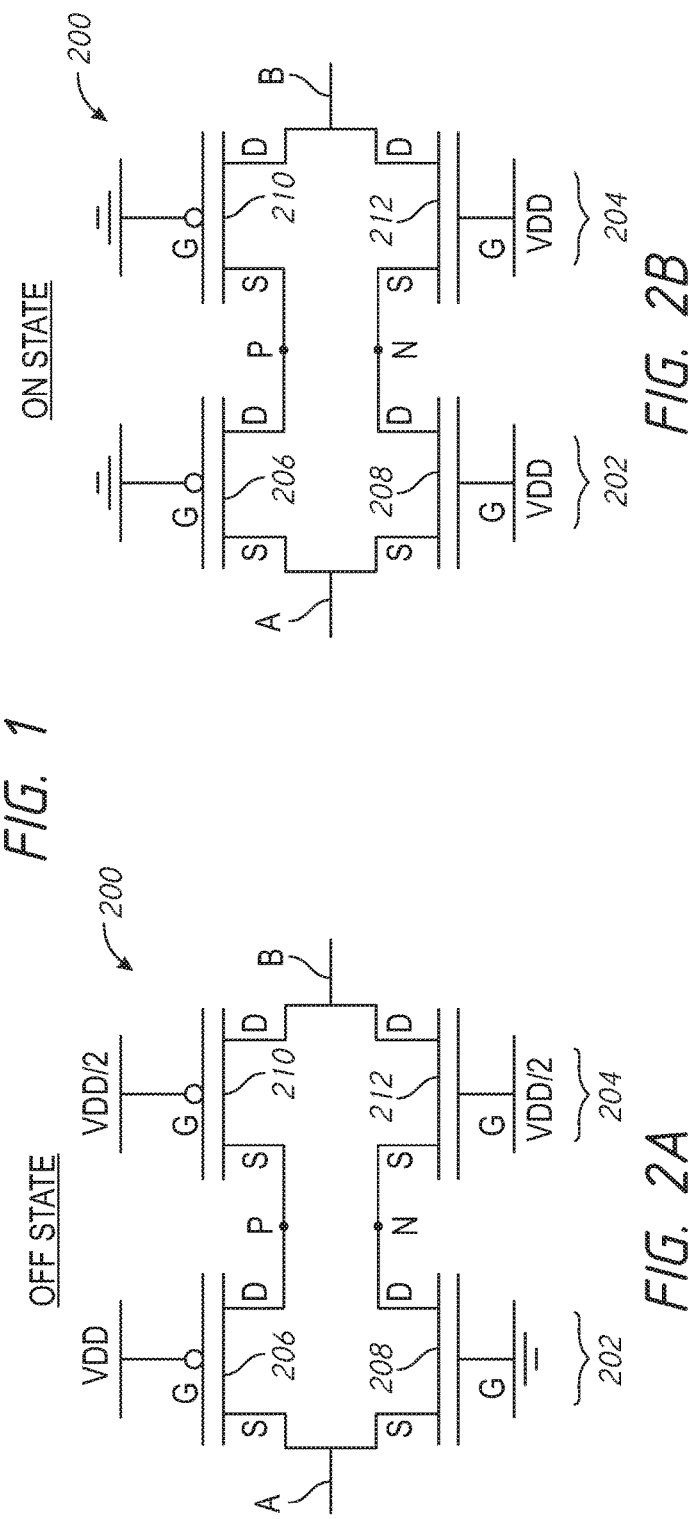
FIG. 2A
FIG. 2B

APPARATUSES FOR REDUCING OFF STATE LEAKAGE CURRENTS

CROSS-REFERENCE TO RELATED APPLICATION

This application is a divisional of U.S. patent application Ser. No. 15/217,449, filed Jul. 22, 2016, now U.S. Pat. No. 9,893,723. This application is incorporated by reference herein in its entirety and for all purposes.

BACKGROUND

Power consumption and performance of integrated circuits are concerns in the ever evolving electronics industry. Reducing power consumption while improving performance are at the forefront of development, especially for integrated circuit manufacturers, e.g., semiconductor device fabricators. Nonetheless, there are still aspects of integrated circuits, leakage current for example, that provide areas for improvement. For example, leakage current of integrated circuits that occurs when a circuit is in an off state may add to power consumption. Additionally, the leakage current may also diminish the performance of one or more circuits. As noted, the additional power consumption is unwanted in today's power efficiency paradigm. And, the diminution of performance is also undesirable, and may ultimately lead to poor performance of applications running on the integrated circuits.

BRIEF DESCRIPTION OF THE DRAWINGS

FIG. 1 is a block diagram of an apparatus in accordance with an embodiment of the present disclosure.

FIGS. 2A and 2B are schematic illustrations of a switch in accordance with an embodiment of the present disclosure.

DETAILED DESCRIPTION

Figure 3A:
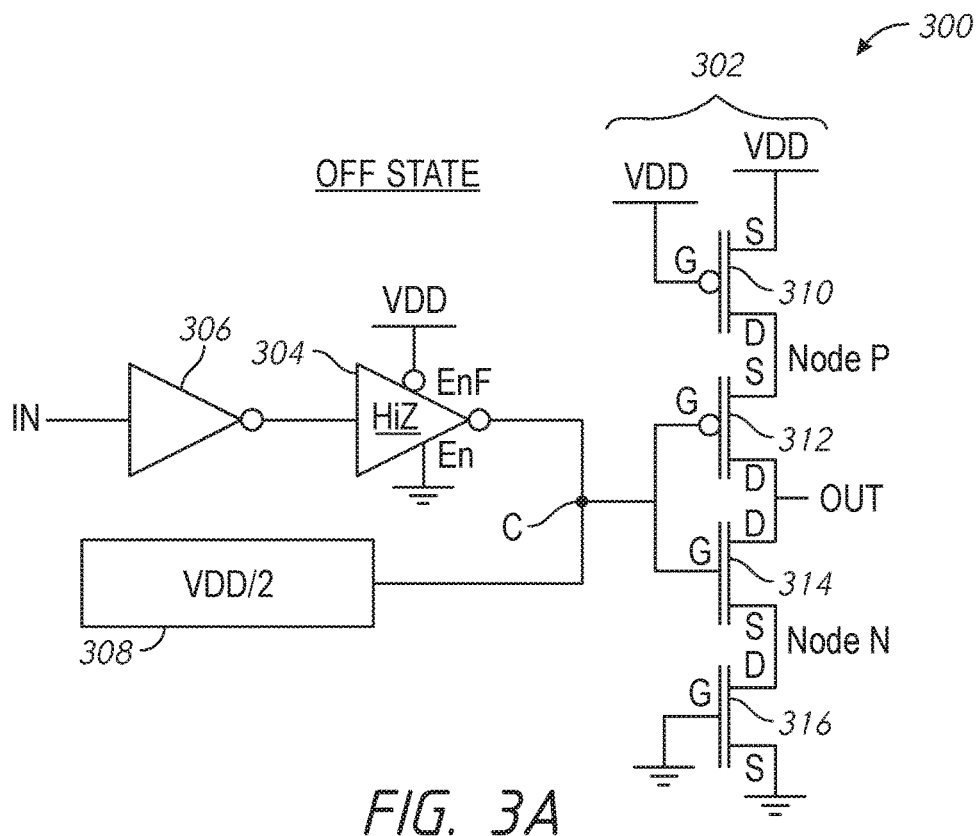
FIGS. 3A and 3B are schematic illustrations of a high impedance inverter circuit in accordance with an embodiment of the present disclosure.

Apparatuses and methods for reducing off state leakage current are disclosed herein. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

As discussed above, leakage current may be undesirable in circuits, such as in integrated circuits. Off-state current leakage of a MOS (metal-oxide-semiconductor) transistor, such as gate induced drain leakage (GIDL), may be an off state leakage current of concern for at least the reasons discussed above. GIDL current stems from the electric field amplification of a junction space charge region occurring where the gate and drain of a MOS transistor tend to overlap. A voltage differential between a gate voltage and a drain voltage of a MOS transistor may induce GIDL current when the MOS transistor is in an off state. For example, for an NMOS transistor, GIDL current may occur when the gate voltage $V_g$ is less than the drain voltage $V_d$. Further, the greater the difference between the two voltages, e.g., $V_g$ and $V_d$, that occurs while the gate voltage is low, e.g., the transistor is in an off state, the greater the GIDL current. For PMOS transistors, the voltages are reversed, e.g., $V_g > V_d$, but the relationship may be analogous. Further, GIDL current may have an exponential relationship with the drain voltage-gate voltage difference. As such, an exponential increase in the GIDL current may occur as the potential difference between $V_g$ and $V_d$ increases. As noted above, current leakage, such as GIDL current, may detrimentally affect the operation of circuits and their operations they are intended to perform.

While there may be process-centric approaches to reducing GIDL leakage, for example, the process-centric approaches may be undesirable in many scenarios. Process-centric approaches may include structural changes to MOS transistors that may lead to additional processes. For example, the process-centric approaches may unduly reduce electrical performance of circuits and may negatively affect the cost of the process. Such process-centric approaches, while warranted in some instances, may desirably be avoided at other times to preserve cost and/or performance.

To further explore the GIDL current with respect to a well-known circuit, GIDL current of a pass gate will be discussed. Take a standard pass gate, for example, that includes a PMOS transistor and an NMOS transistor, where the two transistors are coupled to one another by their source electrodes and their drain electrodes. For such a pass gate, the coupled source electrodes may be considered an input node of the pass gate and the coupled drain electrodes may be considered an output node of the pass gate. The output node may further be coupled to another circuit, which may affect the voltage on the output node at times the pass gate is in an off state. To place the pass gate into an on state, the gate of the PMOS transistor may be coupled to relatively low voltage, e.g., ground, and the gate of the NMOS transistor may be coupled to relatively high voltage, e.g., Vdd. Coupling the gates of the transistors as such may cause both transistors to be conductive. In the on state, a voltage appearing on the input node is coupled to the output node due to both transistors being conductive.

In the off state, which is when the GIDL current is likely to occur, the PMOS and NMOS transistors may be off. For example, the gate of the PMOS transistor may be coupled to a relatively high voltage or Vdd, and the gate of the NMOS transistor may be coupled to a relatively low voltage or ground. The GIDL current may additionally be affected by the voltage on the output node, which may be present on the drain electrodes of both the NMOS and PMOS transistors. As such, the voltage on the output node may affect the voltage difference between the gate voltage $V_g$ and the drain voltage $V_d$ of both the PMOS and NMOS transistors. It should be noted that GIDL current occurs when the gate voltage is low. To reiterate the GIDL current relationship for a MOS transistor in terms of $V_g$ and $V_d$, GIDL for NMOS transistors may occur when drain voltage is greater than the gate voltage, $V_d > V_g$, and increase with increasing $V_d$. GIDL current for PMOS transistors may occur when the drain voltage is less than the gate voltage, $V_d < V_g$, and increase for increasing $V_d$. Additionally, as $V_g$ decreases, the difference between Vg and Vd may increase resulting in increasing GIDL current, where Vd may be fixed. Thus, if the voltage on the output node is high, e.g., Vdd, then Vd is greater than Vg for the NMOS transistor (e.g., Vdd>ground), and Vd may roughly equal Vg for the PMOS transistor. In this example, GIDL may occur for the NMOS transistor due to the low Vg voltage in conjunction with the potential difference between Vg and Vd. If, however, the voltage on the output node is low, e.g., ground, then the voltages may be reversed and GIDL may occur for the PMOS transistor. To summarize, GIDL current may occur when a MOS transistor is non-conductive and may be a function of the potential difference between the drain voltage and the gate voltage of the MOS transistor.

To extend the example, if the pass gate is coupled to an input of a circuit that may be sensitive to leakage current, then the GIDL current may affect the operation of the circuit. For example, if the pass gate is coupled to an integrator that is also coupled to additional circuits providing signals to the integrator, and where the integrator is active while the pass gate is in an off state, the leakage current may be integrated into the other signals received by the integrator. Accordingly, the leakage current may affect the output of the integrator. Thus, a pass gate with reduced or eliminated GIDL current may be desirable, especially in circuits that may be performance sensitive to the leakage current.

One technique to reduce the GIDL current may be to provide a cascode configuration with an intermediate component, one or more transistors for example, between a component susceptible to produce off state leakage current and a node that may be sensitive to such off state leakage current. For example, a pass gate, which may produce GIDL current, may have a second pass gate in a cascode configuration. The cascode configured pass gate may be biased in a conductive state while the first pass gate is off to reduce the presence of GIDL on an output. To reduce or eliminate the GIDL current, the cascode configured pass gate may reduce the drain voltage on the first pass gate's transistors, thereby reducing the Vg to Vd potential difference. Reduced Vg to Vd potential difference may cause a reduction in the off state leakage current. This technique may be extended to high impedance inverters as well as will be discussed below.

FIG. 1 is a block diagram of an apparatus 100 in accordance with an embodiment of the present disclosure. The apparatus 100 may represent at least a portion of a memory, which may be volatile or non-volatile memory, for example. The apparatus 100 includes a switch circuit 102, a sensing circuit 104, and a control circuit 106. The apparatus 100 may receive a signal, from a memory cell for example, and sense the signal to determine a logic state, a "1" or "0" for example, stored on the memory cell. The signal may be either a voltage or a current, or a combination thereof. The sensed signal may then be provided as an output by the sensing circuit 104.

The switch circuit 102 may provide an electrical connection between an input node A and the sensing circuit 104 coupled to an output node B. For example, the switch circuit 102 may include a pass gate, a high impedance inverter, or both, which may couple the input node A to the sensing circuit 104 via an intermediate node included in the switch circuit 102 when the switch circuit 102 is in an on state. In contrast, the switch circuit 102 may decouple the input node A from the intermediate node and the sensing circuit 104 when the switch circuit 102 is in an off state.

The sensing circuit 104 may determine a current or voltage level of the signal with respect to one or more reference levels, and provide a signal indicative of the reference level the signal was most closely related to. The reference level may be indicative of one or more logic states the signal represents. For example, the sensing circuit may provide an output signal of a high voltage level to indicate the input signal represents a logic state of "1." Other logic states are also possible, as are output signals indicative of two or more logic states, "00," "01," "10" or "11" for example. The sensing circuit 104 may be an integrator circuit, a current sense amplifier, or the like, and may sense a voltage/current level of the input signal provided by the switch circuit 102 or other circuit impinging on node B (not shown in FIG. 1).

The control circuit 106 may provide one or more control signals to the switch circuit 102 to control the operational state of the switch circuit. For example, the control circuit 106 may provide one or more reference voltages at various voltage levels to the switch circuit 102 to change the switch circuit 102 between an on and off state. The one or more reference voltages at the various voltage levels may be provided to gate electrodes of one or more transistors to change the operational state of the transistors. The operational states of the transistors may include on, off, and conductive, for example.

In some embodiments, the sensing circuit 104 may be sensitive to leakage current on the input to the sensing circuit 104, e.g., on the intermediate node included in the switch circuit 102. Leakage current occurring on the intermediate node may be provided by the switch circuit 102 at times when the switch is in an off state. The off state leakage current, to which GIDL may be or contribute, may cause the sensing circuit 104 to generate an erroneous output. For example, if the leakage current is high enough to be sensed by the sensing circuit 104, the sensing circuit 104 may provide an output signal indicating a logic state at a time when the sensing circuit 104 should not have been active. To reduce the GIDL current potentially provided by the switch circuit 102, the switch circuit 102 may include one or more cascode configured transistors at its output. The one or more cascode configured transistors may be biased to be in a conductive state even when the switch circuit 102 is in the off state. The cascode configured transistors may reduce a voltage on a drain of another transistor of the switch circuit 102, which may in turn reduce a potential difference between a gate voltage and the drain voltage. The reduced potential difference between the gate and drain voltages may result in reduced or eliminated GIDL current occurring at the output of the switch circuit 102.

Additionally, the one or more cascode configured transistors may isolate the output of the switch from the transistors that may contribute to the GIDL current. The isolation in conjunction with the cascode configured transistors being in a conductive state may, a state in which GIDL current may not be induced, may further contribute to the reduction and/or elimination of the GIDL current.

FIGS. 2A and 2B are schematic illustrations of a switch 200 in accordance with an embodiment of the present disclosure. In some embodiments, the switch 200 may be included in the switch circuit 102 of FIG. 1. FIG. 2A shows the switch 200 biased in an off state condition, and FIG. 2B shows the switch 200 biased in an on state condition. The switch 200 includes a first pass gate 202 and a second pass gate 204. The second pass gate 204 may also be coupled in a cascode configuration to the first pass gate 202. In particular, the sources of transistor 210 and transistor 212 of the second pass gate 204 are coupled to the drains of transistor 206 and transistor 208 of the first pass gate 202. Transistors of the second pass gate 204 may be referred to as cascode coupled with transistors of the pass gate 202. The switch 200 may couple an input signal present on the input node A to the output node B when both the first and second pass gates 202, 204 are in the on state. In contrast, the switch 200 may decouple the input node A from the output node B when the switch 202 is in the off state thereby preventing a signal on the input from appearing on the output. However, while the switch 202 is in the off state, the second pass gate 204 may be in a conductive state. The second pass gate 204 may reduce or eliminate GIDL current generated by transistors of the first pass gate 202 from occurring on the output node B when the switch 200 is in the off state.

The first pass gate 202 may include transistors 206 and 208. In some embodiments, the transistor 206 may be a PMOS transistor, and the transistor 208 may be an NMOS transistor. The source electrodes of both of the transistors 206 and 208 may be coupled together, and may be further coupled to the input node A. The drain electrodes of the two transistors 206 and 208 may be coupled to node P and node N, respectively. The gate electrodes of the two transistors 206 and 208 may be provided a reference voltage, e.g., low or high, depending on a desired operational state of the switch 200, e.g., the on state or the off state.

The second pass gate 204, the cascode coupled pass gate, may include the transistors 210 and 212. The transistors 210 and 212 may be cascode coupled with the transistors 206 and 208, respectively. In some embodiments, the transistor 210 may be a PMOS transistor, and the transistor 212 may be an NMOS transistor. The source electrode of the transistor 210 may be coupled to the node P and the source electrode of the transistor 212 may be coupled to the node N. The drain electrodes of the transistors 210 and 212 may be coupled together, and may be further coupled to the output node B. The gate electrodes of the transistors 210 and 212 may be coupled to a reference voltage, e.g., high, low or intermediate, depending on the desired operational state of the switch 200. The intermediate voltage may be between the high and low reference voltages. For example, given a high voltage of Vdd and a low voltage of ground, the intermediate voltage may be Vdd/2. The value of the intermediate voltage, however, may generally be based on the characteristics of the transistors, the values of the high and low reference voltages, and a desired voltage level that may cause the transistors 210 and 212 to be in a conductive state. In some embodiments, the conductive state may be a linear region of operation of a MOS transistor, and not fully in a saturation region of operation.

Referring to FIG. 2A, the switch 200 is shown in the off state, which may be determined by the reference voltages provided to the gate electrodes of the transistors 206-212. With regards to the switch 200, the off state may imply a "global" off state in that the entire switch 200 may be referred to as off, e.g., the input node A may be decoupled from the output node B. However, while the entire switch 200 may be referred to as off, the first pass gate 202 may be off whereas the second pass gate 204 may be considered to be in a conductive state. In some embodiments, the conductive state may mean that the transistors 210 and 212 of the second pass gate 204 may be in a linear region of operation.

In the off state, a gate electrode of the transistor 206 may be provided a high reference voltage, e.g., Vdd, and a gate electrode of the transistor 208 may be provided a low reference voltage, e.g., ground. With the gate electrodes of the transistors 206, 208 biased accordingly, the two transistors 206, 208 may not conduct between their source and drain electrodes. As such, the first pass gate 202 may be in the off state. Accordingly, a signal present on the input node A may not be provided to the intermediate nodes N and P, or to the output node B.

The second pass gate 204, however, may be in a conductive state due to the gate electrode biasing of the transistors 210 and 212. For example, the gate electrodes of the two transistors 210, 212 may be provided an intermediate voltage, e.g., Vdd/2, which may cause the two transistors 210, 212 to be conductive. Biasing the second pass gate 204 to be in the conductive state may be induced to control the voltages at the intermediate nodes P and N. By placing the second pass gate 204 in the conductive state, any voltage present on the output node B, which may be caused by a circuit coupled to the output node B, such as a sensing circuit, may not affect or cause any GIDL current to be induced in either the transistors 206 or 208. Further, because the voltages on nodes N and P may be a function of the gate voltage and threshold voltage of the two transistors 212, 210, respectively, the voltage difference between the drain voltage Vd and the gate voltage Vg of the two transistors 206, 208 may be reduced. As such, any GIDL current generated by the two transistors 206, 208 may be reduced.

For example, the transistors 210, 212 may have a voltage on their source electrodes based on their respective gate voltages and their respective threshold voltages Vth. For example, the source voltage Vs of the transistor 210 may be Vdd/2–Vth, and similar for the transistor 212. Further, because the source electrodes of the transistors 210, 212 are coupled to the drain electrodes of the transistors 206, 208, respectively, via the nodes P and N, voltages on the source electrodes of the transistors 210, 212 may be coupled to the drain electrodes of the transistors 206, 208, respectively. Accordingly, the voltage on the drain electrodes of the transistors 206, 208 may be Vdd/2–Vth. Hence, due to Vdd/2–Vth being less than Vdd, the potential difference between the drain and gate voltages of both the transistors 206, and 208 may be less than if either of their drain voltages was the full reference voltage Vdd. For example, in the off state the potential difference between Vd and Vg for the transistor 208 may be (Vdd/2–Vth)-ground, which is less than Vdd-ground. Further, the potential difference between the drain and gate voltages of the transistors 206, 208 may not be affected by a voltage on the output node B due to the transistors 210, 212. Therefore, any GIDL current induced in the transistors 206, 208 may be reduced or eliminated. Further, if there is GIDL current induced in those transistors, then the presence of the transistors 210, 212 may reduce any affect the GIDL current may have on the output node B.

Referring to FIG. 2B, which shows the switch 200 in an on state, an input signal on the node A may be coupled to the output node B. The first pass gate 202 may be in an on state because the two transistors 206 and 208 may both be in an on state. For example, the transistor 206 may be in the on state due to the gate electrode of the transistor 206 being provided a low voltage, e.g., ground, and the transistor 208 may be in the on state due to the gate electrode of the transistor 208 being provided a high voltage, e.g., Vdd. Because both transistors of the first pass gate 202 are in the on state, an input signal appearing on the input node A may be coupled to the second pass gate 204 via intermediate nodes P and N. Similar to the voltages provided to the gate electrodes of the transistors 206, 208 of the first pass gate 202, may be provided to the transistors 210 and 212 of the second pass gate 204 so that the second pass gate 204 is in the on state. In contrast to the off state, the transistors 210, 212 of the second pass gate 204 may be in a saturation region of operation when the pass gate 204 is in the on state, as opposed to a linear region of operation. As such, the second pass gate 204 may provide the input signal from the nodes P and N to the output node B.

The switch 200 may be changed between the on and off states by a control circuit (not shown), such as the control circuit 106 of FIG. 1. For example, a control circuit may change the reference voltages provided to the gate electrodes of the transistors 206, 208, 210, and 212 in order to change the switch between the two operational states.

Figure 3B:
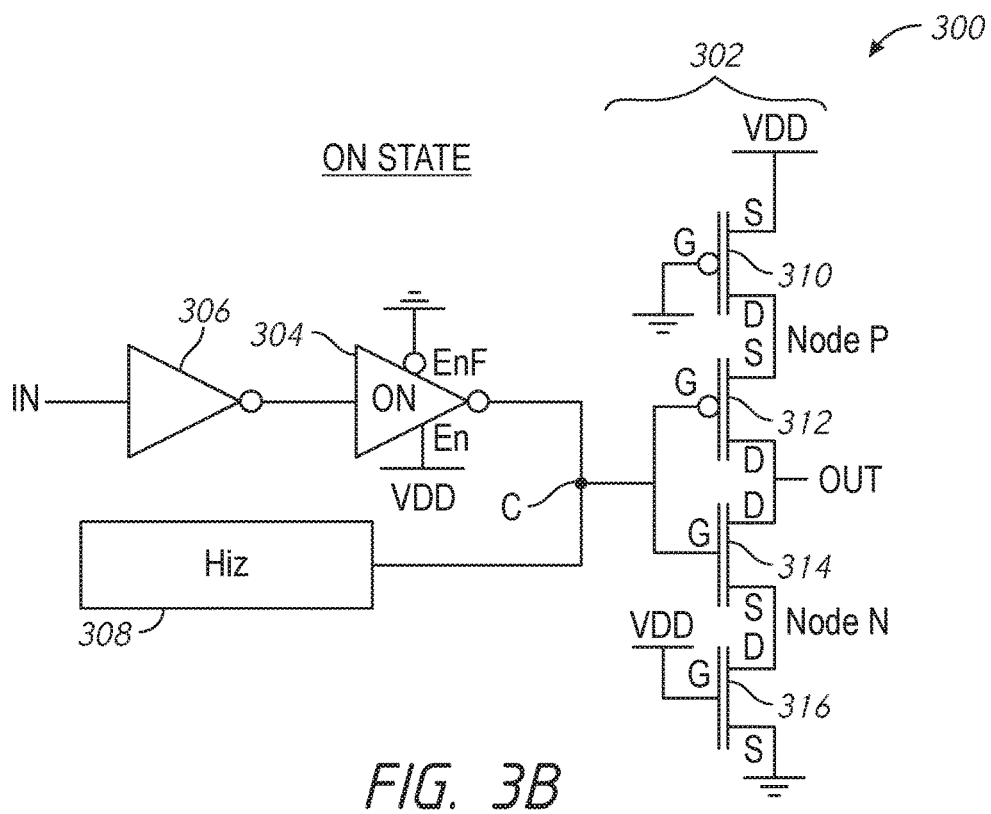

FIGS. 3A and 3B are schematic illustrations of a high impedance inverter circuit 300 in accordance with an embodiment of the present disclosure. FIG. 3A shows the high impedance inverter circuit 300 in an off state operational condition, and FIG. 3B shows the high impedance inverter circuit 300 in an on state operational condition. The on/off state of the high impedance inverter circuit 300 may be dependent upon the biasing conditions provided to various transistors and components, as will be discussed in detail below. The high impedance inverter circuit 300 may limit or reduce off state leakage current, e.g., GIDL current, from appearing on the output node OUT. In a standard high impedance inverter, GIDL current may be induced in the transistors provided the references Vdd and ground, for example. However, by providing an intermediate voltage to node C when the high impedance inverter circuit 300 is in an off state, GIDL current on the output node OUT may be reduced or eliminated because transistors 312 and 314 may be in a conductive state. Placing the transistors 312 and 314 in the conductive state may reduce or eliminate GIDL current for analogous reasons as discussed above with respect to the switch 200.

The high impedance inverter circuit 300 includes an inverter 306, a first high impedance inverter 304, a second high impedance inverter 302, and a voltage source 308. An input of the inverter 306 may be coupled to the input node IN and an output of the inverter 306 may be coupled to an input of the first high impedance inverter 304. An output of the first high impedance inverter 304 may be coupled to node C, which may further be coupled to an input of the second high impedance inverter 302. An output of the second high impedance inverter 302 may be coupled to an output node OUT. Additionally, an output of the voltage source 308 may be coupled to the node C. The voltage source 308 may be any voltage source known in the art. In some embodiments, the voltage source 308 may be diode dividers coupled in either a direct or inverse configuration. In some embodiments, the voltage source 308 may change between providing an intermediate voltage, e.g., a voltage between high and low reference voltages, and providing a high impedance output. In some embodiments, the intermediate voltage may be Vdd/2, where the high and low reference voltages may be Vdd and ground, for example.

The second high impedance inverter 302 includes transistors 310, 312, 314, and 316. In some embodiments, the transistors 310 and 312 may be PMOS transistors, and the transistors 314 and 316 may be NMOS transistors. In some embodiments, the second high impedance inverter 302 may be configured substantially as shown in FIGS. 3A and 3B. For example, a source electrode of the transistor 310 may be coupled to a high reference voltage supply (e.g., Vdd), the drain electrode of the transistor 310 may be coupled to a source electrode of the transistor 312 at node P, and a gate electrode of the transistor 310 may be coupled to a reference voltage source, which may provide one of two reference voltages depending on an operating state of the high impedance inverter circuit 300. Further, the source electrode of the transistor 312 may be coupled to the drain electrode of the transistor 310, a drain electrode of the transistor 312 may be coupled to a drain electrode of the transistor 314, and a gate electrode of the transistor 312 may be coupled to a gate electrode of the transistor 314. The drain electrodes of the transistors 312 and 314 may be further coupled to the output node OUT. The gate electrode of the transistors 312 and 314 may be further coupled to node C. The drain electrode of the transistor 314 may be coupled to the source electrode of the transistor 312, and a source electrode of the transistor 314 may be coupled to a drain electrode of the transistor 316 at node N. A gate electrode of the transistor 316 may be coupled to a reference voltage source, which may provide one of two reference voltages depending on an operating state of the high impedance inverter circuit 300, and a source electrode of the transistor 316 may be coupled to a low reference voltage (e.g., ground).

Referring to FIG. 3A, the high impedance inverter circuit 300 is shown to be in an off state. The off state may be entered based on the various reference voltages provided to the first and second inverters 304, 302 and the output of the voltage source 308. For example, the first inverter 304 may have an inverted enable input EnF provided with a high voltage source, e.g., Vdd, and an enable input En provided with a low voltage source, e.g., ground. Providing references voltages as such may disable the first high impedance inverter 304, and may further place the first high impedance inverter 304 into a high impedance mode. As such, the node C may receive no or little voltage/current from the first high impedance inverter 304. Further, the voltage source 308 may provide an intermediate voltage, e.g., Vdd/2, to node C. Voltage source 308 may provide the intermediate voltage based on a control signal (not shown in FIG. 3A), for example.

Still referring to FIG. 3A, the second high impedance inverter 302 may also be in an off state, in that the output node OUT may be decoupled from the node C. In the off state, the transistors 310 and 316 may be in an off state, while the transistors 312 and 314 may be in a conductive state due to the intermediate voltage provided by the voltage source 308. For example, the gate electrode of the transistor 310 may be provided a high reference voltage, e.g., Vdd, and the gate electrode of the transistor 316 may be provided a low reference voltage, e.g., ground. Additionally, the voltage on node C, e.g., the intermediate voltage, provided by the voltage source 308, may be provided to the gate electrodes of the transistors 312 and 314. Providing the intermediate voltage to the gate electrodes of the transistors 312 and 314 may cause the two transistors 312 and 314 to be in the conductive state. While in the conductive state, the voltage on the source electrodes of transistors 312 and 314 may be determined by their respective gate voltages and their respective threshold voltages. For example, the voltage on the source electrode Vs of the transistor 312 may be Vdd/2−Vth. The source voltage Vs of the transistor 314 may be similar. As such, voltages appearing on the drain electrodes of the transistors 310 and 316 may be the same as the source voltages of the transistors 312 and 314, respectively, due to the drain-source coupling of the transistors. Accordingly, the drain voltage Vd of the transistors 310 and 316 may be Vdd/2−Vth. For example, the drain voltage Vd of the transistor 310 may be at Vdd/2−Vth, where Vth is the threshold voltage of transistor 312, and Vdd/2 is the intermediate voltage on the gate electrode of the transistor 312. The drain voltage of the transistor 316 may be similar. As such, a voltage difference between the gate voltage and the drain voltage of the transistors 310, 316 may be reduced. The reduced drain voltage on the transistors 310 and 316 may reduce or eliminate GIDL current from being induced in either of the transistors 310 or 316.

Referring to FIG. 3B, the high impedance inverter circuit 300 is shown in the on state. The on state is obtained by reversing the voltage of the reference voltages provided to the first high impedance inverter 304, the gate electrodes of the transistors 310 and 316, and placing the output of the voltage source 308 into a high impedance state. For example, the En input of the first high impedance inverter 304 may be provided with a high reference voltage, e.g., Vdd, and the EnF input may be provided with a low reference voltage, e.g. ground, thereby placing the first high impedance inverter 304 into the on state. In the on state, the first high impedance inverter 304 may provide an input signal to the node C. The input signal may be provided by the inverter 306 from the input node IN. The voltage source 308 may be placed into a high impedance state so that the voltage on node C is not affected by the voltage source 308.

The second high impedance inverter 302 may be placed into an on state by placing the transistors 310 and 316 into an on state. For example, the transistor 310 may be placed into the on state by providing a low reference voltage, e.g., ground, to the gate electrode of the transistor 310. Further, the transistor 316 may be placed into the on state by providing a high reference voltage, e.g., Vdd, to the gate electrode of the transistor 316. In the on state, a signal appearing on the node C may be provided to the output node OUT via one of the transistors 312, 314.

The high impendence inverter circuit 300 may be changed between the on and off states by a control circuit (not shown), such as the control circuit 106 of FIG. 1. For example, a control circuit may change the reference voltages provided to the EnF and En inputs of the first high impedance inverter 304 and the gate electrodes of the transistors 310 and 316 in order to change the switch between the two operational states.

Figure 4:
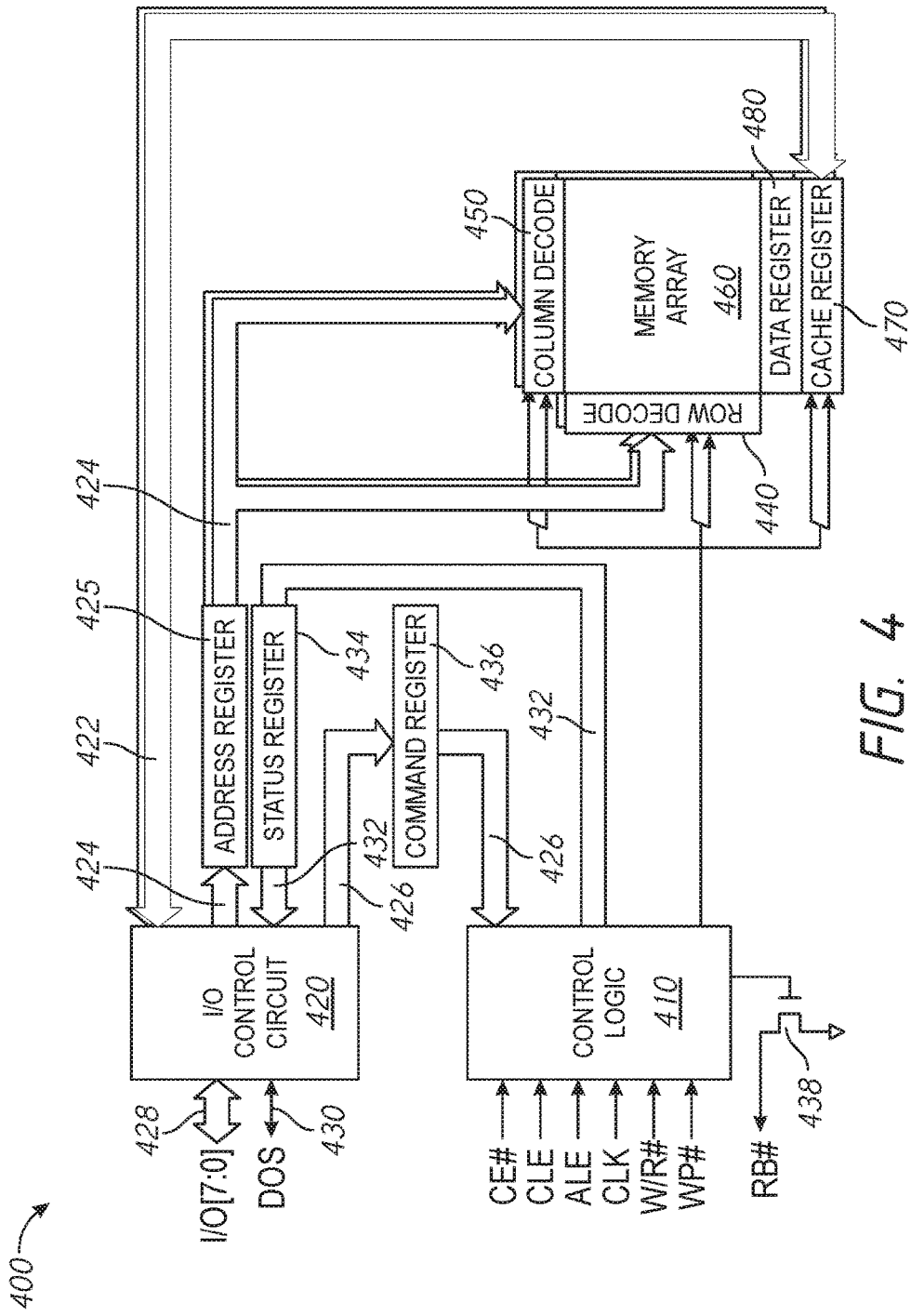
FIG. 4 illustrates a memory according to an embodiment of the present disclosure.

FIG. 4 illustrates a memory 400 according to an embodiment of the present disclosure. The memory 400 includes a memory array 460 with a plurality of memory cells that are configured to store data. The memory cells may be accessed in the array through the use of various signal lines, word lines (WLs), and bit lines (BLs). The memory cells may be non-volatile memory cells, for example, phase change memory cells, or may generally be any type of memory cells. The memory cells may be single level cells configured to store data for one bit of data. The memory cells may also be multi-level cells configured to store data for more than one bit of data.

Commands, address information, and write data may be provided to the memory 400 as sets of sequential input/output (I/O) transmitted through an I/O bus 428. Similarly, read data may be provided from the memory 400 through the I/O bus 428. A data strobe signal DQS may be transmitted through a data strobe bus 430. The DQS signal may be used to provide timing information for the transfer of data to the memory or from the memory. The I/O bus 428 is connected to an I/O control circuit 420 that routes data signals, address information signals, and other signals between the I/O bus 428 and an internal data bus 422, an internal address bus 424, and an internal command bus 426. An address register 425 may be provided address information by the I/O control circuit 420 to be temporarily stored. The I/O control circuit 420 is coupled to a status register 434 through a status register bus 432. Status bits stored by the status register 434 may be provided by the I/O control circuit 420 responsive to a read status command provided to the memory 400. The status bits may have respective values to indicate a status condition of various aspects of the memory and its operation.

The memory 400 also includes a control logic 410 that receives a number of control signals either externally (e.g., CE#, CLE, ALE, CLK, W/R#, and WP#) or through the command bus 426 to control the operation of the memory 400. A command register 436 is coupled to the internal command bus 426 to store information received by the I/O control circuit 420 and provide the information to the control logic 410. The control logic 410 may further access a status register 434 through the status register bus 432, for example, to update the status bits as status conditions change. The control logic 410 is further coupled to a ready/busy circuit 438 to control a value (e.g., logic value) of a ready/busy signal R/B# that may be provided by the memory 400 to indicate whether the memory is ready for an operation or is busy. The control logic 410 may be configured to provide internal control signals to various circuits of the memory 400. For example, responsive to receiving a memory access command (e.g., read, write, program), the control logic 410 may provide internal control signals to control various memory access circuits to perform a memory access operation. The various memory access circuits are used during the memory access operation, and may generally include circuits such as row and column decoders, signal line drivers, data register 480 and cache registers 470, I/O circuits, as well as others.

The address register 425 provides block-row address signals to a row decoder 440 and column address signals to a column decoder 450. The row decoder 440 and column decoder 450 may be used to select blocks of memory cells for memory operations, for example, read, program, and erase operations. The row decoder 440 and/or the column decoder 450 may include one or more signal line drivers configured to provide a biasing signal to one or more of the signal lines in the memory array 460.

In some embodiments, the memory 400 includes a switch according to an embodiment of the invention, for example, the switch 200. The switch may be included in one or more of the circuits of the memory 400, for example, in the column decoder 450, among others. The memory 400 may additionally or alternatively include a high impedance inverter according to an embodiment of the invention, for example, the high impedance inverter circuit 300. The high impedance inverter circuit may be included in one or more of the circuits of the memory 400, for example, in the row decoder 440, among others. Outputs of the switch and/or the high impedance inverter circuit may be coupled to nodes that couple memory cells to sense circuits, such as a current sense amplifier. However, the switch and the high impedance inverter circuit need not control the coupling of memory cells of the memory array and sensing components. When a memory cell of the memory array 460 is to be read or refreshed, for example, the switch and/or the high impedance inverter circuit may be placed in the off state so not to affect the memory cell read operation. While in the off state, the switch and the high impedance inverter circuit may not affect the read or refresh operation since the switch and the high impedance inverter circuit may include GIDL current suppression components, such as cascode coupled pass gates, that may be biased so to reduce any GIDL current that may be generated.

Figure 5:
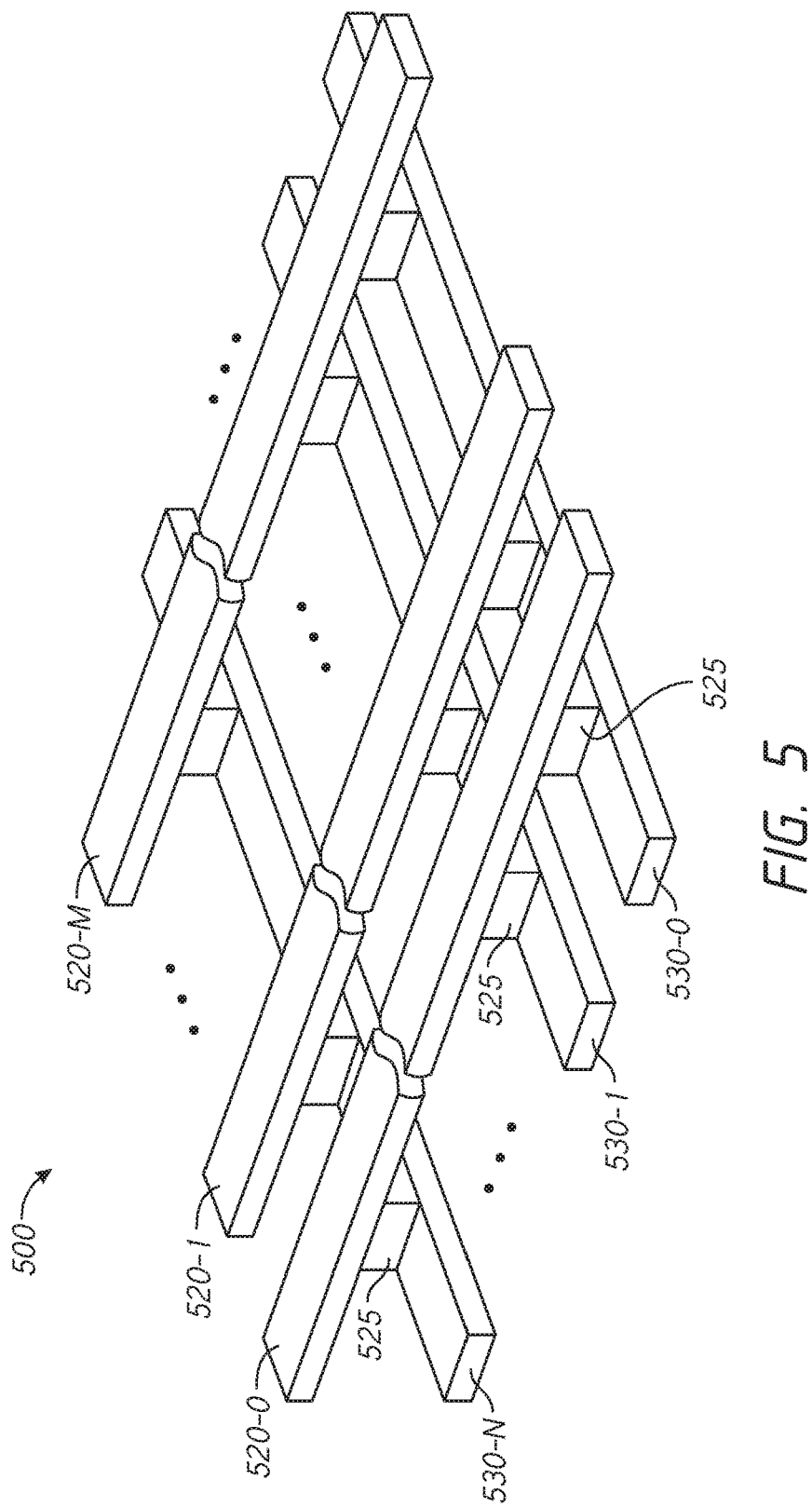
FIG. 5 is a diagram illustrating a portion of an array of memory cells according to an embodiment of the disclosure.

FIG. 5 is a diagram illustrating a portion of an array 500 of memory cells according to an embodiment of the disclosure. The array 500 may be used to implement the memory array 460 of FIG. 4 in some embodiments. In the example illustrated in FIG. 5, the array 500 is a cross-point array including a first number of conductive lines 530-0, 530-1, . . . , 530-N, e.g., access lines, which may be referred to herein as word lines, and a second number of conductive lines 520-0, 520-1, . . . , 520-M, e.g., access lines, which may be referred to herein as bit lines. A memory cell 525 is located at each of the intersections of the word lines 530-0, 530-1, . . . , 530-N and bit lines 520-0, 520-1, . . . , 520-M and the memory cells 525 can function in a two-terminal architecture, e.g., with a particular word line 530-0, 530-1, . . . , 530-N and bit line 520-0, 520-1, . . . , 520-M serving as the electrodes for the memory cells 525.

The memory cells 525 can be resistance variable memory cells, e.g., RRAM cells, CBRAM cells, PCRAM cells, and/or STT-RAM cells, among other types of memory cells like DRAM capacitors or Ferroelectric capacitors. The memory cell 525 can include a material programmable to different data states (e.g., chalcogenide). For instance, the memory cell 525 may be written to store particular levels corresponding to particular data states responsive to applied writing voltage and/or current pulses, for instance. Embodiments are not limited to a particular material or materials. For instance, the material can be a chalcogenide formed of various doped or undoped materials. Other examples of materials that can be used to form storage elements include binary metal oxide materials, colossal magnetoresistive materials, and/or various polymer based resistance variable materials, among others.

In operation, the memory cells 525 of array 500 can be written to by applying a voltage, e.g., a write voltage, across the memory cells 525 via selected word lines 530-0, 530-1, . . . , 530-N and bit lines 520-0, 520-1, . . . , 520-M. A sensing, e.g., read, operation can be used to determine the data state of a memory cell 525 by sensing current, for example, on a bit line 520-0, 520-1, . . . , 520-M corresponding to the respective memory cell responsive to a particular voltage applied to the selected word line 530-0, 530-1, . . . , 530-N to which the respective cell is coupled.

Figure 6:
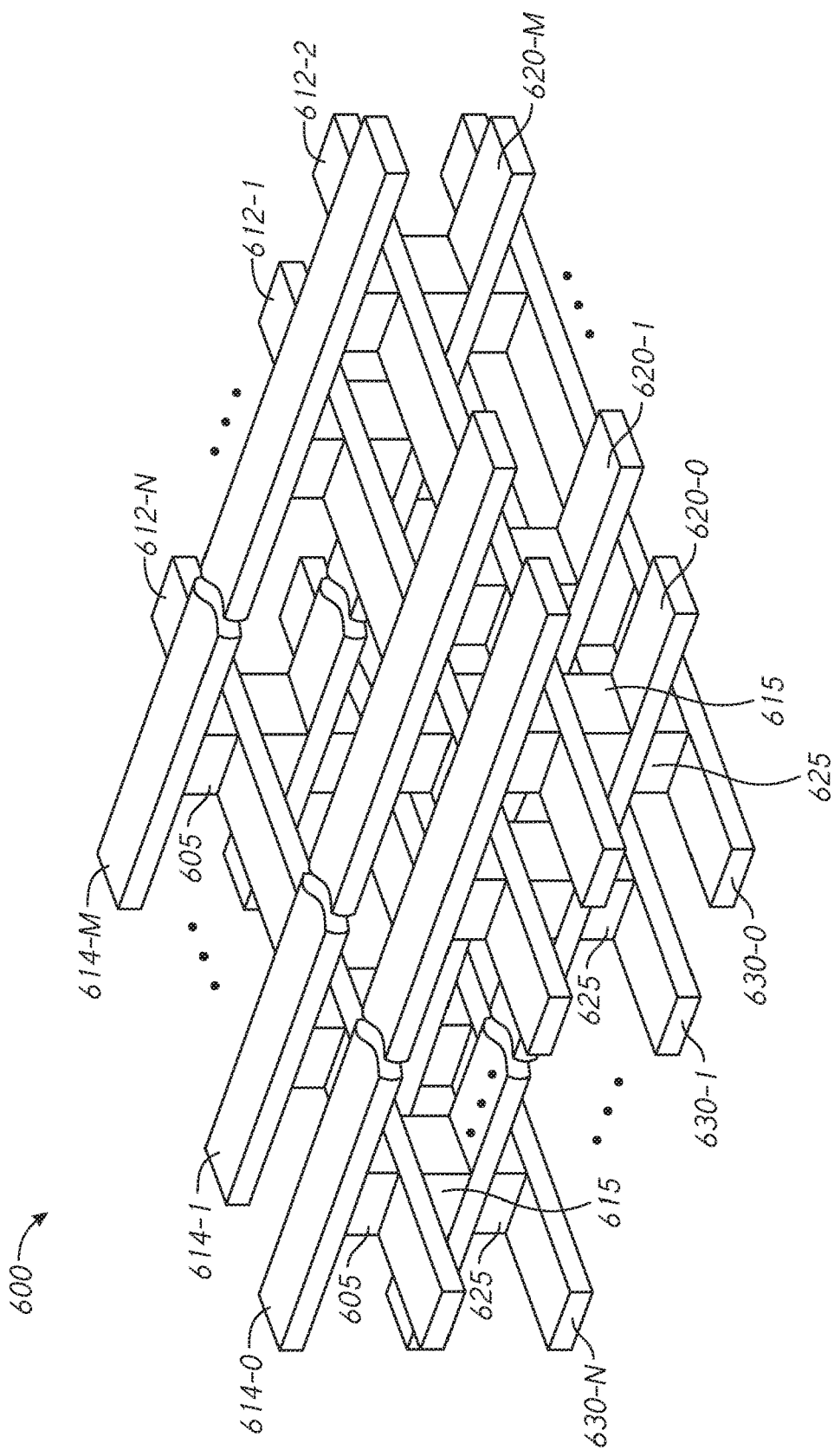
FIG. 6 is a diagram illustrating a portion of an array of memory cells according to an embodiment of the disclosure.

FIG. 6 is a diagram illustrating a portion of an array 600 of memory cells. The array 600 may be used to implement the memory array 460 of FIG. 4 in some embodiments. In the example illustrated in FIG. 6, the array 600 is configured in a cross-point memory array architecture, e.g., a three-dimensional (3D) cross-point memory array architecture. The multi-deck cross-point memory array 600 includes a number of successive memory cells, e.g., 605, 615, 625 disposed between alternating, e.g., interleaved, decks of word lines, e.g., 630-0, 630-1, . . . , 630-N and 612-0, 612-1, . . . , 612-N extending in a first direction and bit lines, e.g., 620-0, 620-1, . . . , 620-M and 614-0, 614-1, . . . , 614-M extending in a second direction. The number of decks can be expanded in number or can be reduced in number, for example. Each of the memory cells 605, 625 can be configured between word lines, e.g., 630-0, 630-1, . . . , 630-N and 612-0, 612-1, . . . , 612-N and bit lines, e.g., 620-0, 620-1, . . . , 620-M and 614-0, 614-1, . . . , 614-M, such that a single memory cell 605, 625 is directly electrically coupled with and is electrically in series with its respective bit line and word line. For example, array 600 can include a three-dimensional matrix of individually-addressable, e.g., randomly accessible, memory cells that can be accessed for data operations, e.g., sense and write, at a granularity as small as a single storage element or multiple storage elements. In a number of embodiments, memory array 600 can include more or less bit lines, word lines, and/or memory cells than shown in the examples in FIG. 6.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
   a voltage source configured to provide an intermediate reference voltage or be in a high impedance state based on a control signal;
   a first high impedance inverter having an input and an output, and further having an enable input and a not enable input, wherein the first high impedance inverter is in an off state or an on state based on a voltage coupled to the enable and not enable inputs; and
   a second high impedance inverter coupled to the first high impedance inverter and the voltage source at an input, wherein the second high impedance inverter comprises:
      a first transistor having a gate, a source and a drain electrode, wherein the source electrode is coupled to a high reference voltage, and the gate electrode is coupled to a low or high reference voltage based on an operational state of the second high impedance inverter;
      a second transistor having a gate, a source and a drain electrode, wherein the source electrode is coupled to the drain electrode of the first transistor, and wherein the gate electrode is coupled to the output of the first high impedance inverter and further coupled to the voltage source;
      a third transistor having a gate, a source and a drain electrode, wherein the drain electrode is coupled to the drain electrode of the second transistor, wherein the gate electrode is coupled to the output of the first high impedance amplifier and further coupled to the voltage source, and wherein the drain electrodes of the second and third transistors are coupled to the output of the second high impedance inverter; and
      a fourth transistor having a source, a drain, and a gate electrode, wherein the drain electrode of the fourth transistor is coupled to the source electrode of the third transistor, and the source electrode is coupled to a low reference voltage, and wherein the gate electrode is coupled to the low or high reference voltage based on an operational state of the second high impedance inverter.

2. The apparatus of claim 1, wherein the first high impedance inverter is in the on state when the not enable input is coupled to a low reference voltage input and the enable input is coupled to a high reference voltage input.

3. The apparatus of claim 1, further comprising an inverter having an input and an output,
   wherein the input of the inverter is coupled to an input node, and
   wherein the output of the inverter is coupled to the input of the first high impedance inverter.

4. The apparatus of claim 1, wherein the second high impedance inverter is in an on state when the gate electrode of the first transistor is coupled to the low reference voltage, the gate electrode of the fourth transistor is coupled to the high reference voltage, and the voltage source is in a high impedance state.

5. The apparatus of claim 4, wherein the second and third transistors are in a conductive state when the second high impedance inverter is in an off state.

6. The apparatus of claim 1, wherein the second high impedance inverter is in an off state when the gate electrode of the first transistor is coupled to the high reference voltage, the gate electrode of the fourth transistor is coupled to the low reference voltage, and the voltage source provides the intermediate reference voltage to the gate electrodes of the second and third transistors.

7. The apparatus of claim 1, wherein, when the first high impedance inverter is disabled and in a high impedance mode, a common node that is a node coupled to the output of the first high impedance inverter and further coupled to the voltage source receives a lower voltage from the first high impedance inverter in comparison to a voltage received by the common node when the first high impedance inverter is not in the high impedance mode.

8. The apparatus of claim 1, wherein, when the second high impedance inverter is in an off state, the output of the second high impedance inverter is decoupled from the output of the first high impedance inverter and from the voltage source.

9. The apparatus of claim 1, wherein, when the second high impedance inverter is in an off state, the first and fourth transistors are in an off state and the second and third transistors are in a conductive state due to the intermediate reference voltage provided from the voltage source to the second high impedance inverter.

10. An apparatus, comprising:
a voltage source coupled to a common node, the voltage source configured to provide an intermediate reference voltage or be in a high impedance state;
a first high impedance inverter including an output coupled to the common node; and
a second high impedance inverter including:
an input coupled to the common node; and
first, second, third, and fourth transistors coupled in series,
the first and fourth transistors including first and fourth gate electrodes, respectively, each of the first and fourth gate electrodes coupled to a low or high reference voltage based on an operational state of the second high impedance inverter,
the second and third transistors including second and third gate electrodes, respectively, each of the second and third gate electrodes coupled to the common node.

11. The apparatus of claim 10, wherein the first high impedance inverter is in an on state when a first input and a second input of the first high impedance inverter are coupled to the low and high reference voltages, respectively.

12. The apparatus of claim 10, wherein the second high impedance inverter is in an on state when the gate electrodes of the first and fourth transistors are coupled to the low and high reference voltages, respectively, and the voltage source is in the high impedance state.

13. The apparatus of claim 10, wherein the second high impedance inverter is in an off state when the gate electrodes of the first and fourth transistors are coupled to the high and low reference voltages, respectively, and the voltage source provides the intermediate reference voltage to the gate electrodes of the second and third transistors.

14. The apparatus of claim 10, wherein the first transistor further includes a first source electrode and a first drain electrode, and the first source electrode is coupled to the high reference voltage,
wherein the second transistor further includes a second source electrode and a second drain electrode, the second source electrode is coupled to the first drain electrode, and the second drain electrode is coupled to an output of the second high impedance inverter,
wherein the third transistor further includes a third source electrode and a third drain electrode, and the third drain electrode is coupled to the output of the second high impedance inverter, and
wherein the fourth transistor further includes a fourth source electrode and a fourth drain electrode, the fourth drain electrode is coupled to the third source electrode, and the fourth source electrode is coupled to the low reference voltage.

15. The apparatus of claim 10, further comprising an inverter having an input and an output,
wherein the input of the inverter is coupled to an input node, and
wherein the output of the inverter is coupled to an input of the first high impedance inverter.

16. The apparatus of claim 10, wherein, when the first high impedance inverter is disabled and in a high impedance mode, the common node receives a lower voltage from the first high impedance inverter in comparison to a voltage received by the common node when the first high impedance inverter is not in the high impedance mode.

17. An apparatus, comprising:
an inverter including a first input and a first output;
a voltage source including a second input and a second output, the second output coupled to a common node, the voltage source configured to provide an intermediate reference voltage or be in a high impedance state;
a first high impedance inverter including a third input and a third output, the third input coupled to the second output, the third output coupled to the common node; and
a second high impedance inverter including:
a fourth input and a fourth output, the fourth input coupled to the common node; and
a first transistor including first gate, source and drain electrodes, the first source electrode coupled to a high reference voltage, the first gate electrode coupled to the high reference voltage or a low reference voltage based on an operational state of the second high impedance inverter;
a second transistor including second gate, source and drain electrodes, the second source electrode coupled to the first drain electrode, the second gate electrode coupled to the common node;
a fourth transistor including third gate, source and drain electrodes, the third drain electrode coupled to the second drain electrode, the third gate electrode coupled to the common node, the second and third drain electrodes coupled to the fourth output; and
a fourth transistor including third gate, source and drain electrodes, the fourth drain electrode coupled to the third source electrode, the third source electrode coupled to the low reference voltage, the fourth gate electrode coupled to the low or high reference voltage based on the operational state of the second high impedance inverter.

18. The apparatus of claim 17, wherein the first high impedance inverter is in an on state when a not enable input and an enable input of the first high impedance inverter are coupled to low and high reference voltages, respectively.

19. The apparatus of claim 17, wherein the second high impedance inverter is in an on state when the gate electrodes of the first and fourth transistors are coupled to the low and high reference voltages, respectively, and the voltage source is in a high impedance state.

20. The apparatus of claim 17, wherein the second high impedance inverter is in an off state when the gate electrodes of the first and fourth transistors are coupled to the high and low reference voltages, respectively, and the voltage source provides the intermediate reference voltage to the gate electrodes of the second and third transistors.

* * * * *